(12) United States Patent
Shiota et al.

(10) Patent No.: US 11,972,991 B2
(45) Date of Patent: Apr. 30, 2024

(54) SEMICONDUCTOR DEVICE (71) Applicant: Mitsubishi Electric Corporation, Tokyo (JP)

(72) Inventors: Hiroki Shiota, Tokyo (JP); Tetsuo Motomiya, Tokyo (JP); Kunihiko Tajiri, Tokyo (JP); Jun Okada, Tokyo (JP); Hiroumi Yamada, Tokyo (JP); Kazutake Kadowaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 501 days.

(21) Appl. No.: 17/413,950

(22) PCT Filed: Feb. 1, 2019

(86) PCT No.: PCT/JP2019/003641
§ 371 (c)(1),
(2) Date: Jun. 15, 2021

(87) PCT Pub. No.: WO2020/157960
PCT Pub. Date: Aug. 6, 2020

(65) Prior Publication Data
US 2022/0084899 A1 Mar. 17, 2022

(51) Int. Cl.
*H01L 23/06* (2006.01)
*B32B 27/12* (2006.01)
(Continued)

(52) U.S. Cl.
CPC .............. *H01L 23/06* (2013.01); *B32B 27/12* (2013.01); *H01L 23/04* (2013.01); *H01L 23/562* (2013.01);
(Continued)

(58) Field of Classification Search
CPC . H01L 23/06; H01L 2924/181; H01L 23/562; H01L 2924/1811;
(Continued)

(56) References Cited

U.S. PATENT DOCUMENTS

| 4,162,514 A | * | 7/1979 | De Bruyne | ......... H01L 23/4924 |
| | | | | 174/559 |
| 4,426,659 A | * | 1/1984 | de Bruyne | .............. H01L 23/60 |
| | | | | 257/763 |

(Continued)

FOREIGN PATENT DOCUMENTS

| CN | 1246728 A | 3/2000 |
| JP | 7-86500 A | 3/1995 |

(Continued)

OTHER PUBLICATIONS

Chinese Office Action dated Sep. 21, 2023 in corresponding Chinese Patent Application No. 201980088933.1 (with machine-generated English translation), 11 pages.

(Continued)

*Primary Examiner* — Jasper Saberi
(74) *Attorney, Agent, or Firm* — XSENSUS LLP (57) ABSTRACT

A semiconductor device includes: an inner frame that surrounds an outer circumference of a semiconductor chip; and an outer frame that surrounds an outer circumference of the inner frame; wherein the outer frame is configured with an exterior wall that surrounds the outer circumference of the inner frame, and a fibrous reinforcing member that is wound on an outer circumference of the exterior wall. This prevents the broken pieces of a component that constitutes the semiconductor device from being scattered outside the semiconductor device, thereby not only to achieve improvement in the reliability of the entire system, but also to achieve downsizing of the semiconductor device.

20 Claims, 10 Drawing Sheets

(51) Int. Cl.
  *H01L 23/00* (2006.01)
  *H01L 23/04* (2006.01)
  *H01L 25/07* (2006.01)
(52) U.S. Cl.
  CPC ...... *H01L 25/072* (2013.01); *H01L 2924/171* (2013.01); *H01L 2924/1711* (2013.01); *H01L 2924/1715* (2013.01); *H01L 2924/181* (2013.01); *H01L 2924/1811* (2013.01); *H01L 2924/1815* (2013.01)
(58) Field of Classification Search
  CPC ....... H01L 2924/1815; H01L 2924/171; H01L 2924/1711; H01L 2924/1715; B32B 2457/14; B32B 27/12
  See application file for complete search history.

(56) References Cited

U.S. PATENT DOCUMENTS

| | | |
|---|---|---|
| 6,295,205 B1 | 9/2001 | Lang et al. |
| 2016/0111554 A1 | 4/2016 | Kuwahara et al. |
| 2016/0247736 A1* | 8/2016 | Kuwahara ............... H01L 23/18 |
| 2017/0207211 A1* | 7/2017 | Kuwahara ............... H01L 24/72 |

FOREIGN PATENT DOCUMENTS

| | | |
|---|---|---|
| JP | 2000-91455 A | 3/2000 |
| JP | 2014-130875 A | 7/2014 |
| JP | 2016-82105 A | 5/2016 |
| JP | 2017-84850 A | 5/2017 |
| JP | 2018-56244 A | 4/2018 |
| WO | 2015/178393 A1 | 11/2015 |

OTHER PUBLICATIONS

International Search Report and Written Opinion dated Apr. 23, 2019, received for PCT Application PCT/JP2019/003641, Filed on Feb. 1, 2019, 9 pages including English Translation.

* cited by examiner

SEMICONDUCTOR DEVICE

CROSS-REFERENCE TO RELATED APPLICATION

The present application is based on PCT filing PCT/JP2019/003641, filed Feb. 1, 2019, the entire contents of which is incorporated herein by reference.

TECHNICAL FIELD

The present application relates to a semiconductor device.

BACKGROUND ART

In association with increased operation speeds and enhanced performances of semiconductor devices, the voltages applied to the semiconductor devices are becoming higher than ever before. Increase in the amount of power flowing through the semiconductor device may possibly cause a failure of a semiconductor chip therein. Because of a short-circuit current that may flow due to the failure of the semiconductor chip, the semiconductor chip may be melted, so that the inside of the semiconductor device may reach a high temperature. This may result in rapid elevation of the air pressure inside the semiconductor device, thus causing breakage of the semiconductor device. In order to ensure reliability of the semiconductor device to be operated under a high voltage and a large amount of current, it is required that if the semiconductor chip in the semiconductor device is broken, a system incorporated with the semiconductor device does not get broken, namely, improvement in strength is required for the semiconductor device.

With respect to the above requirement for improving the reliability of the semiconductor device, in Patent Document 1, for example, it is disclosed that an expandable protective sheath is fitted on a casing that encloses the semiconductor device, so that broken pieces of the casing that may be generated by its breakage caused when the semiconductor chip is broken, are trapped by the protective sheath, to thereby prevent objects around the semiconductor device from being broken. Further, in Patent Document 2, it is disclosed that fibers are contained in a resin frame that surrounds a semiconductor chip in a semiconductor device, so that another semiconductor chip therein without causing short-circuit breakage itself, is prevented from being broken. Further, in Patent Document 3, such design approach is disclosed in which the inner diameter of a ceramic casing that encloses a semiconductor device is reduced to increase the thickness of that casing, to thereby restrain the breakage of a semiconductor element in the semiconductor device, from impacting the outside of the semiconductor device.

CITATION LIST

Patent Document

Patent Document 1: Japanese Patent Application Laid-open No. 2000-91455 (Paragraphs 0010 to 0018; FIG. 1)
Patent Document 2: Japanese Patent Application Laid-open No. 2017-84850 (Paragraphs 0079 to 0081; FIG. 14)
Patent Document 3: Japanese Patent Application Laid-open No. 2016-82105 (Paragraphs 0017 to 0043; FIG. 2)

SUMMARY OF THE INVENTION

Problems to be Solved by the Invention

According to the semiconductor device having the protective sheath as shown in Patent Document 1, it is possible to trap the broken pieces of the casing generated due to breakage of the semiconductor device caused by melting of the semiconductor chip; however, in the case of a structure in which multiple semiconductor devices and components are adjacent to each other, there is a problem that ejection of hot air, etc. may impact the outside of the semiconductor device, and thus the reliability of such an entire system cannot be ensured. Further, there is a problem that dimensional restrictions are placed on the thickness and the inner diameter of the casing that encloses the semiconductor device and, in view of eliminating the impact of bursting of the casing, these restrictions may disturb the semiconductor device from being downsized.

Further, according to Patent Document 2, since a casing that establishes separation between the inside and the outside of the semiconductor device will burst, there is a problem that it is difficult to prevent ejection of hot air, etc. caused by melting of the semiconductor chip, and scattering of a broken inner component, from impacting the outside of the semiconductor device.

Further, according to Patent Document 3, since dimensional restrictions are imposed on the inner diameter and the thickness of the ceramic casing, there is a problem that design flexibility of the semiconductor device and a system partially including the semiconductor device is prevented from increasing, so that it is not possible to satisfy the demand to downsize the semiconductor device.

This application discloses a technique for solving such problems described above, and an object thereof is to provide a semiconductor device which not only suppresses the breakage due to a high voltage and a large amount of current to thereby achieve improvement in the reliability of the entire system, but also achieves downsizing of the semiconductor device.

Means for Solving the Problems

A semiconductor device disclosed in this application is characterized by comprising: a first frame that surrounds an outer circumference of a semiconductor chip; and a second frame that surrounds an outer circumference of the first frame; wherein the second frame is composed of an exterior wall that surrounds the outer circumference of the first frame, and a fibrous reinforcing member that is wound on an outer circumference of the exterior wall.

Effect of the Invention

According to this application, because of the provision of the second frame configured with the exterior wall and the reinforcing member, it is possible not only to suppress the breakage due to a high voltage and a large amount of current, to thereby achieve improvement in the reliability of the entire system, but also to achieve downsizing of the semiconductor device.

MODES FOR CARRYING OUT THE INVENTION

Embodiments according to this application will be described in detail below. Note that the embodiments described below don't limit this application and further, the figures used for the description schematically show the content of this application and thus, any shape, size or positional relationship is not limited to those in the figures.

Embodiment 1

Embodiment 1 will be described. A semiconductor device here is such a semiconductor device represented by a power conversion semiconductor device that uses at least one semiconductor chip and that is employed, for example, in a substation facility, namely, a so-called pressure-contact type semiconductor device including a cover plate on the upper side of the semiconductor chip and a base plate on the lower side the semiconductor chip; however, the type of a semiconductor device according to this application is not limited thereto. The semiconductor chip is located below the cover plate and above the base plate, and is electrically connected, while being pressed by a power feeding member and an electrode plate respectively disposed on the upper and lower sides of the semiconductor chip, to each of respective elements adjoined to them. Further, the semiconductor chip is a current switching element and here, there is provided such a structure in which multiple semiconductor chips are isolated from each other by means of an inner frame disposed in the semiconductor device. Other than the power feeding member, a signal terminal is disposed on the semiconductor chip in order to cause switching of current, and one end of the signal terminal is connected to a signal pad of the semiconductor chip, while the other end is connected to a gate/emitter signal board disposed under the cover plate. The outer circumference of the inner frame is surrounded by an outer frame, and the outer frame is configured in such a manner that an exterior wall disposed so as to surround the inner frame is surrounded by a reinforcing member. Further, there may be cases where one semiconductor device is used and where multiple semiconductor devices are used in a stacked manner. Further, in case of lack of the inner frame as a constituent, such a structure is provided in which the semiconductor chips are surrounded by the outer frame.

Figure 1:
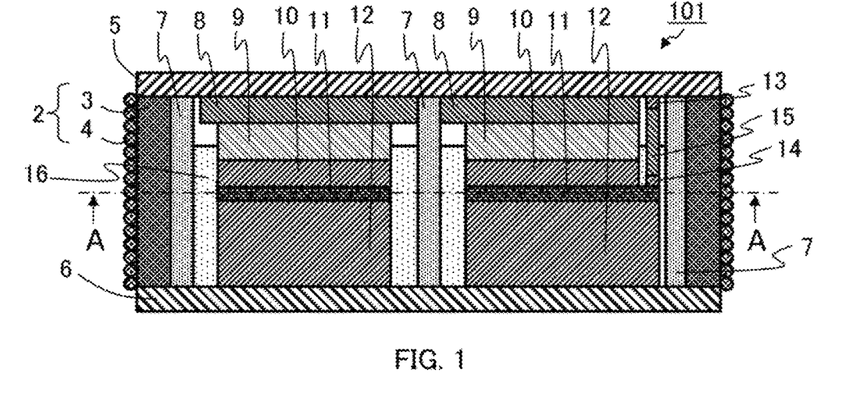
FIG. 1 is a longitudinal sectional view showing a configuration of a semiconductor device according to Embodiment 1.

FIG. 1 is a longitudinal sectional view showing a configuration of a semiconductor device 101 according to Embodiment 1. The semiconductor device 101 includes semiconductor chips 11. The semiconductor chips 11 are each electrically connected, by means of a main electrode 10 provided on the semiconductor chip 11, to an over-chip electrode plate 9 provided on the main electrode 10, and the over-chip electrode plate 9 is connected to a power feeding member 8 that is disposed on the over-chip electrode plate 9. Further, on the lower side of the semiconductor chip 11, an under-chip electrode plate 12 is provided. The power feeding member 8 and the under-chip electrode plate 12 are electrically connected to each other in such a manner that they are pressed by and between a cover plate 5 disposed on the power feeding member 8 and a base plate 6 disposed on the lower side of the under-chip electrode plate 12. The cover plate 5 and the under-chip electrode plate 12 serve as a collector electrode and an emitter electrode, respectively, and when a terminal is drawn out of the semiconductor chip 11, the terminal can be used as a gate terminal. The semiconductor chips 11 are each a semiconductor chip represented by an IGBT (Insulated gate bipolar transistor) or the like, and the semiconductor chip 11 is provided with a signal terminal 14 and is connected, by means of a gate/emitter electrode 15, to a gate/emitter signal board 13 connected to the cover plate 5. Further, the respective semiconductor chips 11 and electrodes, etc. connected to the semiconductor chips 11, are spatially isolated from each other by means of an inner frame 7 as a first frame that is formed of a thermosetting resin such as an epoxy resin, polyimide resin or the like, or a thermoplastic resin such as PPS (Polyphenylene sulfide), PET (Polyethylene terephthalate), PBT (Polybutylene terephthalate) or the like. In order to improve the insulating property, the inside of the semiconductor device 101 is sealed with a sealant 16 formed of an electrically insulating gas, a silicone gel or the like. The material and the filling degree of the sealant 16 may be determined arbitrarily. Further, an outer frame 2 as a second frame is provided on the outer circumference of the inner frame 7. The outer frame 2 is configured with an exterior wall 3, and a reinforcing member 4 such as, for example, a fiber.

Figure 2:
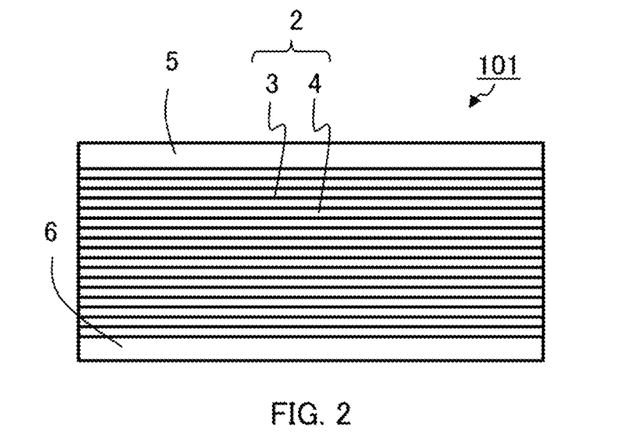
FIG. 2 is a side view showing a configuration of the semiconductor device according to Embodiment 1.
Figure 4:
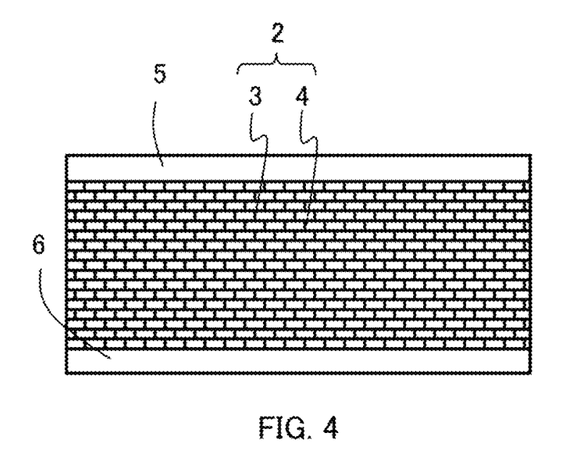
FIG. 4 is a side view showing another configuration about the semiconductor device according to Embodiment 1.

FIG. 2 is a side view showing a configuration of the semiconductor device 101 according to Embodiment 1 of this application. The semiconductor device 101 has a configuration whose circumference is surrounded by the outer frame 2, and the exterior wall 3 as a configuration element of the outer frame 2 is surrounded by the reinforcing member 4. The reinforcing member 4 is wound on the outer circumference of the exterior wall 3 for the purpose of ensuring its rupture strength with respect to the direction in which the broken pieces generated due to short-circuit breakage of the semiconductor chip 11 will be scattered. This is to constrain, by virtue of the reinforcing member 4, deformation of the exterior wall 3 that may be caused by scattering of the broken pieces of the semiconductor chip 11, to thereby prevent the exterior wall 3 from causing bursting. According to this configuration, it is possible to efficiently achieve improvement in the rupture strength of the semiconductor device. Note that the winding width, direction and interval for the reinforcing member 4, and the force for winding, may be determined arbitrarily in the ranges not affecting the operations of the semiconductor device, so far as they are enough to constrain the deformation of the exterior wall 3 to thereby achieve an effect of preventing the exterior wall 3 from bursting. Also, the number of turns may be determined arbitrarily, and from a similar point of view, the reinforcing member 4 may be wound in a multi-layered manner around the exterior wall 3. When the reinforcing member 4 is wound in a multi-layered manner, the constraint force for preventing the deformation of the exterior wall 3 can be enhanced. Further, as exemplified by FIG. 4, the reinforcing member 4 may be processed into a woven fabric having a strength in terms of structure, to thereby enhance the constraint force against the deformation of the exterior wall 3 that may be caused by the bursting. Furthermore, the shape of the reinforcing member 4 surrounding the exterior wall 3 may be determined arbitrarily, and the reinforcing members 4 of different shapes and different materials may be overlapped to surround the exterior wall 3, to thereby satisfy an intended shock resistance.

Figure 3:
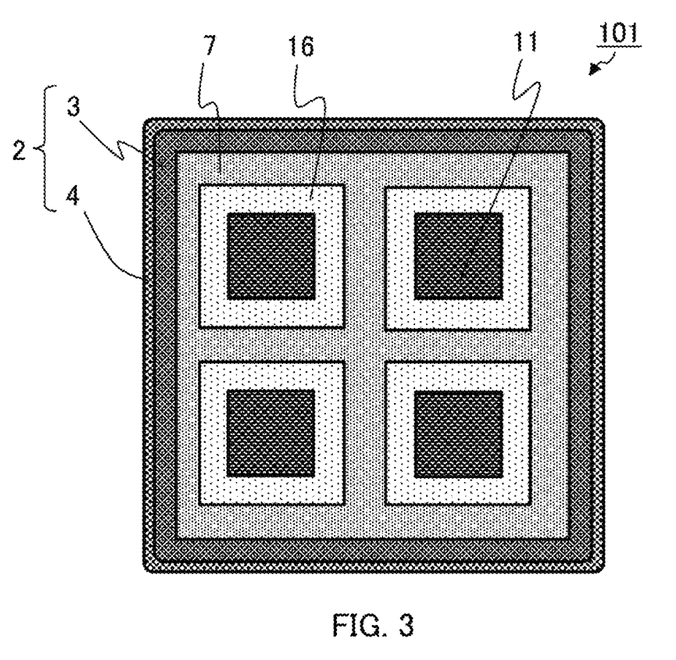
FIG. 3 is a cross-sectional view showing a configuration of the semiconductor device according to Embodiment 1.
Figure 5:
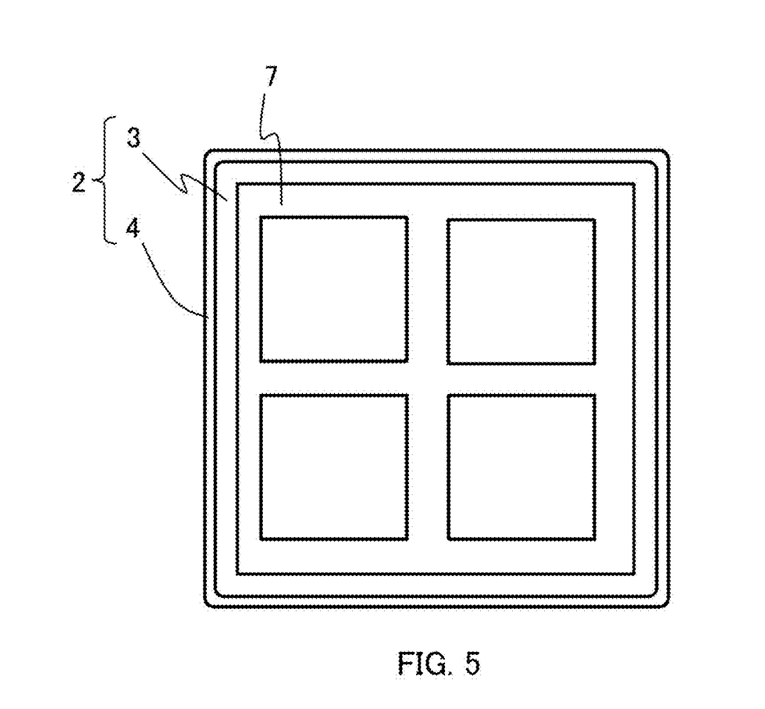
FIG. 5 is a top view showing configuration elements of the semiconductor device according to Embodiment 1.

FIG. 3 is a cross-sectional view on arrow A-A of the semiconductor device 101 shown in FIG. 1 according to Embodiment 1 of this application. The inner frame 7 surrounds at least one semiconductor chip 11 and, as seen in FIG. 5 shown as a top view of the inner frame 7 and the outer frame 2, the semiconductor chips 11, the over-chip electrode plates 9, the under-chip electrode plates 12 and respective components associated therewith are disposed in the inner frame 7, and the sealant 16 is sealed therein as described previously.

In the thus-configured semiconductor device 101, if the semiconductor chip 11 is short-circuited, an overcurrent flows in the semiconductor chip 11, whereby, when the semiconductor chip 11 is melted, the temperature inside the inner frame 7 is elevated significantly. In accordance with the temperature elevation inside the inner frame 7, the pressure of a closed portion inside the inner frame 7 is elevated rapidly, and this creates a risk that the inner frame 7 may burst. Supposing that one of the mutually-isolated semiconductor chips 11 is short-circuited to cause bursting of the inner frame 7, in order to prevent another one of them without damage from being impacted by that bursting, the inner frame may have such a structure by which the shock resistance is improved, for example, a structure containing fibers in that frame. However, it is difficult to completely prevent the bursting from impacting the outside of the semiconductor device, only by means of the inner frame that is subject to restrictions in design to ensure a reduced size, an electrical insulating property, or the like, of the semiconductor device.

Accordingly, as shown in FIG. 1 to FIG. 3, the outer frame 2 is provided outside the inner frame 7, so that the inner frame that separates the inside and the outside of the semiconductor device 101 is restrained from bursting and, even if the inner frame has burst, the bursting is prevented from impacting the outside of the semiconductor device.

This application is intended to prevent the bursting of the inner frame from impacting the outside of the semiconductor device. When bursting of the inner frame 7 has occurred due to the failure of the semiconductor chip 11, broken pieces of the inner frame 7 may be splashed toward the outer frame 2; however, these broken pieces will be absorbed by the exterior wall 3 that constitutes the semiconductor device 101 and that is formed of a polymeric material having a shock resistance higher than that of the material used for the inner frame 7. Here, the "polymeric material" means that having a molecular weight of ten thousand or more.

As the material used for the inner frame 7, the previously-cited thermosetting resin or thermoplastic resin is assumed, whereas, in order to withstand a short-time shock caused at the time of bursting of the inner frame 7, the polymeric material used for the exterior wall 3 has a shock resistance and a shock absorptivity that are higher than those of the material used for the inner frame 7 that constitutes the semiconductor device 101.

In addition, after the inner frame 7 is broken due to elevation of the pressure inside the inner frame 7 caused by melting of the semiconductor chip 11, such elevation of the pressure also impacts the outside of the inner frame 7 and this may cause deformation of the exterior wall 3; however, the deformation of the exterior wall 3 is constrained by the reinforcing member 4 formed of a polymeric material having a rupture strength higher than that of the material used for the exterior wall 3, so that the elevated pressure is not locally concentrated on the exterior wall 3 and thus, bursting of the exterior wall 3 does not occur. Accordingly, it is possible to prevent the bursting from impacting the outside of the outer frame 2, so that devices such as another semiconductor device, a cooling device, etc., or parts thereof, that are placed adjacent to the semiconductor device 101 can be protected. Note that the materials used for the inner frame 7, the exterior wall 3 and the reinforcing member 4 described above, may be determined using a selection method in which properties of materials to be used for the respective constituents are compared with each other.

Figure 6:
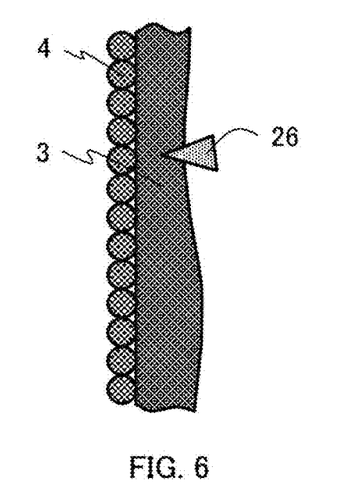
FIG. 6 is a diagram for illustrating an effect of the semiconductor device according to Embodiment 1.

FIG. 6 is a diagram illustrating an effect created when the semiconductor device 101 according to Embodiment 1 of this application is used. When the semiconductor chip 11 in the semiconductor device 101 is broken to be melted, the temperature and the pressure inside the semiconductor device 101 are elevated. Because the semiconductor device 101 has a closed structure, elevation of the pressure inside the semiconductor device 101 causes bursting of a structural object surrounding the semiconductor chip 11, for example, the inner frame 7, so that a broken piece 26 is splashed in a direction toward the outside of the semiconductor device 101. Since the exterior wall 3 is formed of a material having a shock resistance higher than that of the material used for the inner frame 7 that constitutes the semiconductor device 101, and thus having a high toughness, it is possible to capture the above splashed broken piece 26 without allowing it to pass through that wall.

It is noted again that deformation of the exterior wall 3 may occur due to elevation of the pressure. When the deformation occurs and it is locally significant, the elevated pressure will be concentrated thereon, resulting in fracture beginning at a portion of that deformation. According to this application, outside the exterior wall 3, the reinforcing member 4 is provided that has a rupture strength higher than that of the material used for the exterior wall 3. This prevents occurrence of such local deformation and thus prevents the bursting of the inner frame 7 from impacting the outside of the semiconductor device.

If the surrounding exterior wall 3 of the semiconductor device 101 is used alone, the exterior wall 3 will burst by the deformation due to elevation of the internal pressure of the semiconductor device 101 caused by melting of the semiconductor chip 11. Further, if the exterior wall 3 is not attached and thus the reinforcing member 4 is used as a protective sheath for capturing the broken piece 26 of the inner frame 7 without through the exterior wall 3, the reinforcing member 4 will be fractured by the broken piece 26 of the inner frame 7 splashed by the bursting thereof. As just described, no significant effect is achieved when either of the exterior wall 3 and the reinforcing member 4 is used alone; however, combining multiple structures of them in the above manner, makes it possible to improve the shock resistance.

Therefore, according to a system configured to include, as a part of the whole, the semiconductor device 101 of this application, because of the above-described effects, it becomes easier to make the system redundant enough to allow the system to be operable as a whole even if the semiconductor device 101 itself has failed. Further, the upper and lower sides of the semiconductor device 101 are pressed by the cover plate 5 and the base plate 6 in a manner sandwiched therebetween, to thereby make pressure contact with these plates, so that ejection of hot air, etc. in a vertical direction of the semiconductor device 101 caused by the bursting, does not impact the outside of the semiconductor device 101.

In the semiconductor device 101 of a pressure-contact type, respective elements in the semiconductor device 101 can be electrically connected to each other without using a bonding wire or the like. In this case, because no bonding wire is used for electrical connection, in the semiconductor device 101, there is no wire bonding portion that may cause thermal fatigue, and this provides an effect that the heat resistance of the semiconductor device is improved. However, like in a semiconductor device of another type such as a package type, for example, respective elements in the semiconductor device may be electrically connected to each other by using a bonding wire or the like.

Further, the outer frame 2 has a structure that constrains deformation of the exterior wall 3 by means of the reinforcing member 4 to thereby withstand the elevation of the pressure inside the semiconductor device 101 caused by melting of the semiconductor chip 11, so that it is not necessary to design the exterior wall 3 itself to have a dimension such as a thickness or the like that does not allow bursting of the exterior wall. Thus, if the exterior wall 3 is designed to have a thickness that allows the exterior wall 3 to be deformed to cause bursting by itself, because the reinforcing member 4 constrains the exterior wall 3 from bursting, the outer frame 2 does not cause bursting. This effect makes it possible to downsize the outer frame 2 while keeping its shock-resistant capability, so that the design flexibility of the entire system is improved.

Further, the size and the shape of the semiconductor device 101 in which the outer frame 2 is employed, are not limited. Namely, because the exterior wall 3 and the reinforcing members 4 are highly processable, there is no limit on the thickness of the exterior wall 3 and the length of the reinforcing member 4, so that whether or not to employ the outer frame 2 is not determined by the number of the semiconductor chips 11 that constitute the semiconductor device 101 and the magnitude of the voltage applied to the semiconductor device 101. The exterior wall 3 and the reinforcing member 4 may be designed to have dimensions that are matched with the energy involved in the semiconductor device 101 at the time of the melting and the size of the semiconductor device 101.

An outer circumference portion of the semiconductor device 101 is surrounded by the exterior wall 3 formed of a polymeric material whose shock resistance to a short-time shock is high. Further, as the material that forms the exterior wall, an ultra-high-molecular-weight polyethylene resin is preferable that is superior to other polymeric materials in shock resistance to a short-time shock. Here, the "ultra-high-molecular-weight" means a molecular weight of one million or more.

Furthermore, the exterior wall 3 is surrounded by the reinforcing member 4 formed of a polymeric material having a high rupture strength, to thereby constitute the outer frame 2. Examples of the polymeric material having a high rupture strength to be used for the reinforcing member 4 include, for example, polyamide, modified-polyphenylene ether and the like. However, as the material that forms the reinforcing member 4, an ultra-high-molecular-weight polyethylene fiber is preferable that is superior to other polymeric materials in rupture strength.

In this manner, the outer circumference of the inner frame 7 is surrounded by the outer frame 2, so that the shock-resistant capability is improved. The ultra-high-molecular-weight polyethylene resin has a very low water absorbability, and is thus a material that does not absorb water. Accordingly, moisture is prevented from entering into the semiconductor device, so that it is possible to prevent the semiconductor device 101 from being deteriorated due to water absorption. Further, the ultra-high-molecular-weight polyethylene resin is superior in abrasion resistance, so that when the ultra-high-molecular-weight polyethylene resin is employed as the material for the exterior wall 3, it can be expected to achieve an increased lifetime and an enhanced reliability of the semiconductor device 101.

Meanwhile, the elements of the semiconductor device 101 are formed of a variety of materials and thus, in the semiconductor device 101 in which heat is generated by its operation, a repeated stress will occur due to the difference in thermal expansion between the respective materials. The ultra-high-molecular-weight polyethylene fiber used for the reinforcing member 4 is superior in fatigue resistance and thus can ensure a high rupture strength even if the above repeated stress has occurred, so that it can be expected to achieve an increased lifetime of the semiconductor device 101.

In particular, the exemplary polymeric materials shown in the aforementioned embodiment, such as, an ultra-high-molecular-weight polyethylene resin used for the exterior wall 3 and an ultra-high-molecular-weight polyethylene fiber used for the reinforcing member 4, are characterized by being lower in weight than ceramic as inorganic-material sintered compact, and metal. This makes it possible not only to downsize the semiconductor device but also to make a weight-saving design thereof. Further, the ultra-high-molecular-weight polyethylene fiber is a material having a high fatigue resistance and thus will not easily be fractured even if elevation of the temperature and elevation of the pressure in the semiconductor device occur repetitively under conditions of the semiconductor device in use, so that it can be expected to achieve improved reliability of the semiconductor device. The above-cited ultra-high-molecular-weight polyethylene resin used for the exterior wall 3 has been used for a blade of a bulldozer and a bulletproof plate against large bullets, and the ultra-high-molecular-weight polyethylene fiber used for the reinforcing member 4 is a fiber that has been employed as a yacht rope, a fishing line for a very large fish such as marlin or the like, and they are materials suited to achieving the effects according to this application.

Although the inner frame 7 is formed of a material having an electrical insulation property, such as the thermoplastic resin or the thermosetting resin previously shown as an example, it is conceivable that the material and the shape of the inner frame 7 are not specified like the above, and that the semiconductor device is that which does not have the inner frame 7, though depending on the type of embodiment. However, using the inner frame 7 makes it possible to isolate the respective semiconductor chips 11 from each other, to thereby prevent, more efficiently, the bursting due to breakage and melting of the semiconductor chip 11 from impacting the outside of the semiconductor device 101.

The cover plate 5 and the base plate 6 are formed of electrically conductive substances, and examples of materials of the cover plate 5 and the base plate 6 include molybdenum. These plates make pressure contact with the semiconductor chips 11 uniformly from the upper and lower sides, so that the semiconductor chips 11 are electrically connected to the cover plate 5 and the base plate 6.

As the sealant 16, a gaseous insulating material or a solid insulating material is used. In the case of employing a gaseous sealing material as the sealant 16, an inert gas is filled in the semiconductor device to be hermetically sealed therein. This prevents corrosion of each of the electrode plates, etc., so that it can be expected to achieve an increased lifetime of the semiconductor device 101. Further, when a solid sealant such as a silicone gel is filled as the sealant 16, the shock resistance is further improved because expandable air is less likely to exist around the semiconductor chip 11.

In order to reduce the deformation amount of the exterior wall 3, it is recommended to avoid a gap between the exterior wall 3 and the reinforcing member 4. To do so, it is assumed to apply an adhesive to the reinforcing member 4 to thereby adhere it to the exterior wall 3. However, how to attach the reinforcing member to the exterior wall may be determined arbitrarily, and it is appropriate if the exterior wall 3 and the reinforcing member 4 are attached to each other without creating a gap therebetween.

As described above, the semiconductor device 101 according to Embodiment 1 comprises: the inner frame 7 that surrounds the outer circumference of the semiconductor chip 11; and the outer frame 2 that surrounds the outer circumference of the inner frame 7; wherein the outer frame 2 is configured with the exterior wall 3 that surrounds the outer circumference of the inner frame 7, and the fibrous reinforcing member 4 that is wound on the outer circumference of the exterior wall 3. Thus, it is possible not only to suppress the breakage due to a high voltage and a large amount of current, to thereby achieve improvement in the reliability of the entire system, but also to achieve downsizing of the semiconductor device.

Further, the shape of the outer frame 2 may be designed arbitrarily. Thus, with respect to how to design the entire system partially including the semiconductor device according to this application, devices such as a cooling device and a power source, that may, if damaged, impact the operation of the entire system, or their parts, circuits or the like, may be located near the semiconductor device, so that the design flexibility of the entire system is further improved.

Embodiment 2

In Embodiment 1, the description has been made on a case where the outer frame 2 whose cross-section is rectangular is provided, whereas in Embodiment 2, description will be made on a case where an outer frame whose cross-section is circular is provided.

Figure 7:
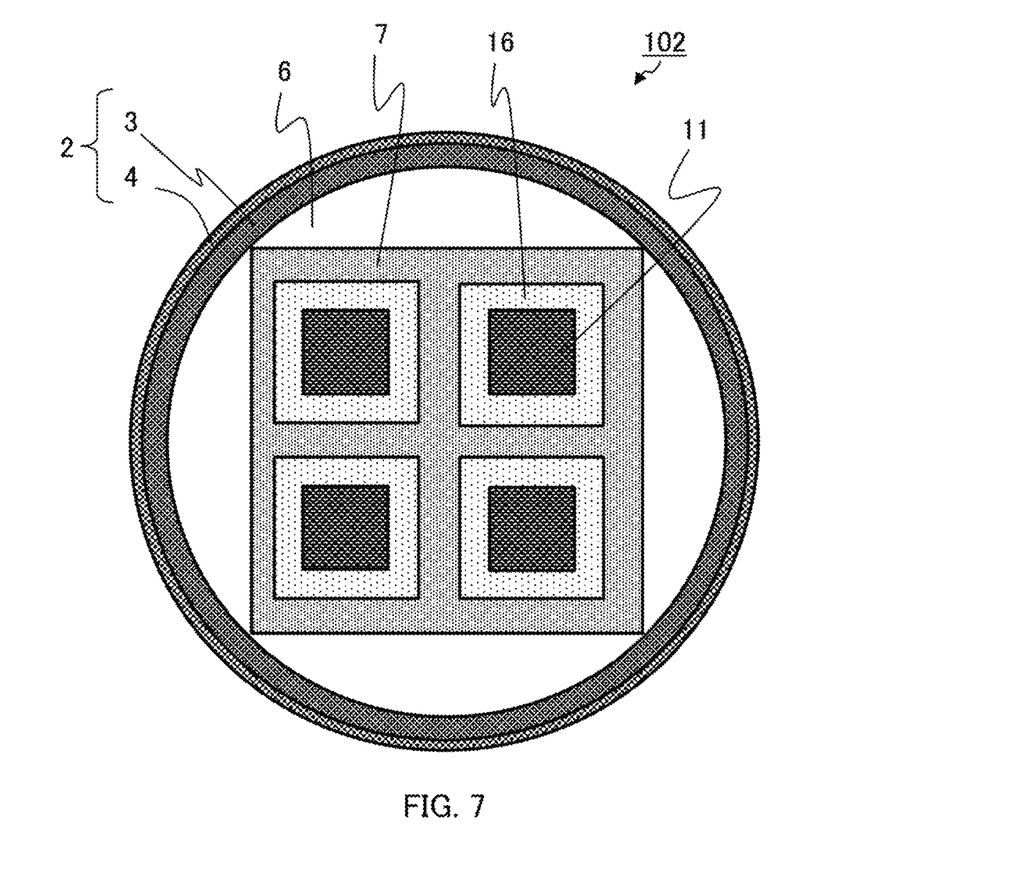
FIG. 7 is a cross-sectional view showing a configuration of a semiconductor device according to Embodiment 2.

FIG. 7 is a cross-sectional view showing a configuration of a semiconductor device 102 according to Embodiment 2. As shown in FIG. 7, in the semiconductor device 102, an outer frame 2 is provided in a cylindrical shape. The outer frame 2 is configured with a cylindrical exterior wall 3 that surrounds the inner frame 7 and a fibrous reinforcing member 4 that is wound around the cylindrical exterior wall 3. The material that forms the exterior wall 3 is a polymeric material having good formability, for example, an ultra-high-molecular-weight polyethylene resin, and thus can form any given shape. The other configuration of the semiconductor device 102 according to Embodiment 2 is similar to that in the semiconductor device 101 of Embodiment 1 and thus, for the equivalent parts, the same reference numerals are given, so that description thereof will be omitted.

As described above, in accordance with the semiconductor device 102 according to Embodiment 2, the outer frame 2 is provided in a cylindrical shape, so that it is possible to achieve improvement in shock resistance and rupture strength.

Embodiment 3

In Embodiment 1 and Embodiment 2, the description has been made on cases where the thickness of the exterior wall 3 is uniform, whereas in Embodiment 3, description will be made on a case where a specific portion of the exterior wall 3 is made thicker than the other portion.

Figure 8:
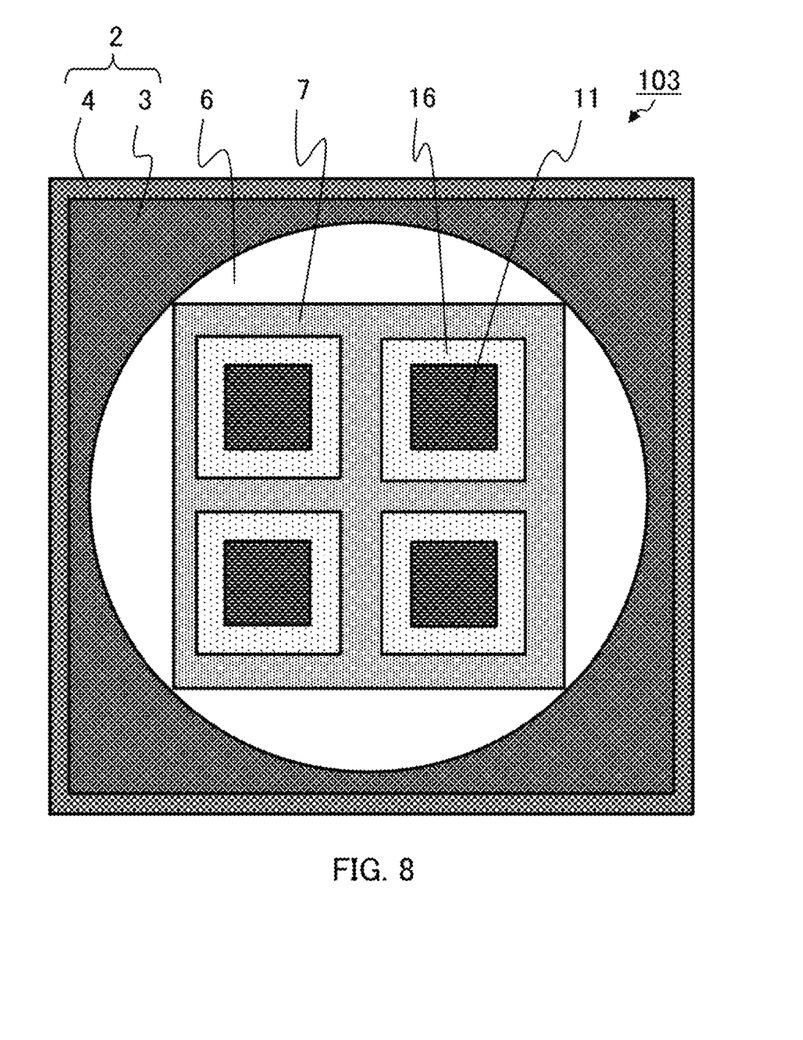
FIG. 8 is a cross-sectional view showing a configuration of a semiconductor device according to Embodiment 3.

FIG. 8 is a cross-sectional view showing a configuration of a semiconductor device 103 according to Embodiment 3. As shown in FIG. 8, in an outer frame 2 of the semiconductor device 103, an exterior wall 3 is provided to have a rectangular shape as an outer shape thereof and a circular shape as an inner shape thereof. This results in a configuration in which corner portions of the exterior wall 3 are made thicker than the other portion. The other configuration of the semiconductor device 103 according to Embodiment 3 is similar to that in the semiconductor device 101 of Embodiment 1 and thus, for the equivalent parts, the same reference numerals are given, so that description thereof will be omitted.

When the outer and inner circumferences of the exterior wall 3 form polygonal shapes similar to each other, there is a risk that a shock wave and its reflective wave at the time of the bursting will be concentrated on the corner portion, resulting in fracture beginning at the corner portion. Further, when the outer and inner circumferences of the exterior wall 3 form circular shapes similar to each other, because the shock wave and the reflective wave will be reflected uniformly, the rupture strength of the exterior wall is improved; however, the semiconductor device forms a circular cylinder, so that unnecessary space may be increased.

Thus, according to a configuration in which corner portions are made thicker as described above, it is possible to design the outer frame 2 so as not to burst if, on the corner portion in the polygonal shape of the exterior wall 3, stress concentration occurs due to the internal pressure of the semiconductor device 103 caused by melting of the semiconductor chip 11. Accordingly, because of the shape of the outer frame 2, it becomes easier to design a semiconductor device which can obtain a useful effect on its shock resistance and its designing.

As described above, in accordance with the semiconductor device 103 according to Embodiment 3, the exterior wall 3 is provided to have a polygonal shape as the outer shape and a circular shape as the inner shape. Thus, even though the outline of the outer frame is polygonal, it is possible to prevent the breakage due to stress concentration on the corner portion, to thereby achieve improvement in shock resistance.

Embodiment 4

In Embodiment 1 to Embodiment 3, the description has been made on cases where the reinforcing member 4 is wound along an external surface of the exterior wall 3, whereas in Embodiment 4, description will be made on a case where a reinforcing member is wound along grooves provided in the exterior wall 3.

Figure 9:
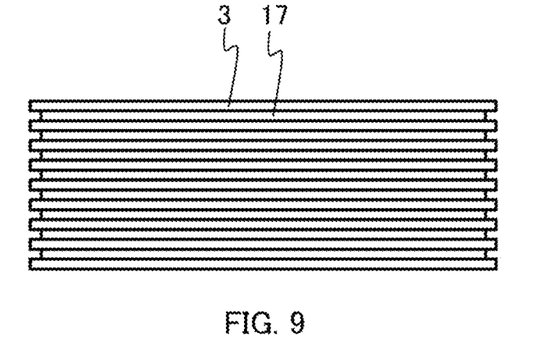
FIG. 9 is a side view showing a configuration of an exterior wall in a semiconductor device according to Embodiment 4.

FIG. 9 is a side view showing a configuration of an exterior wall 3 in a semiconductor device 104 according to Embodiment 4. As shown in FIG. 9, according to an outer frame 2 of the semiconductor device 104, on the external surface of the exterior wall 3, grooves 17 for fitting the reinforcing member 4 are formed. When the reinforcing member 4 is wound in a fitting manner into the thus-formed grooves 17, the reinforcing member 4 is fixed to the exterior wall 3 more tightly than when the reinforcing member 4 is wound around the exterior wall 3 in which no groove is formed. The other configuration of the semiconductor device 104 according to Embodiment 4 is similar to that in the semiconductor device 101 of Embodiment 1 and thus, for the equivalent parts, the same reference numerals are given, so that description thereof will be omitted.

Due to elevation of the internal pressure of the semiconductor device 104 caused by melting of the semiconductor chip 11, the exterior wall 3 in the semiconductor device 104 will be so deformed as to locally produce swelling. When the elevated pressure is concentrated on the aforementioned local swelling, the exterior wall 3 may cause fracturing beginning at that swelling. However, when the reinforcing member is wound in a fitting manner into the grooves 17 of the exterior wall 3 as described above, the reinforcing member 4 is tightly fixed to the exterior wall 3 and thus, it is prevented that the local swelling occurs in the exterior wall and the pressure is concentrated thereon to cause bursting of the exterior wall. Thus, endurance of the semiconductor device with respect to bursting is improved. Such an outer frame itself that surrounds a semiconductor device is also usable as a structure to withstand elevated pressures other than for the semiconductor device which is required to be downsized.

As described above, in accordance with the semiconductor device 104 according to Embodiment 4, the grooves 17 along which the reinforcing member 4 is wound in a fitting manner into the grooves are provided in the exterior wall 3. Thus, the reinforcing member is tightly fixed to the exterior wall 3, so that the exterior wall is prevented from bursting, to thereby achieve improvement in the endurance.

Embodiment 5

In Embodiment 1 to Embodiment 4, the description has been made on cases where the semiconductor device is of a pressure-contact type, whereas in Embodiment 5, description will be made on a case where the semiconductor device is that in which electrical connections are established using bonding wires or the like.

Figure 10:
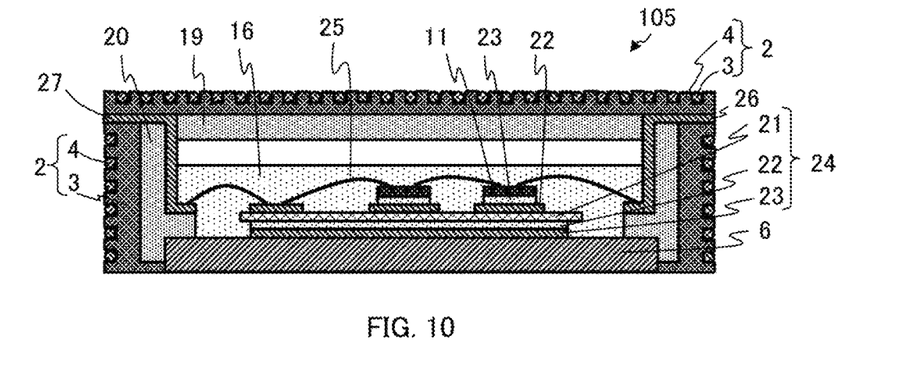
FIG. 10 is a longitudinal sectional view showing a configuration of a semiconductor device according to Embodiment 5.

FIG. 10 is a longitudinal sectional view showing a configuration of a semiconductor device 105 according to Embodiment 5. As shown in FIG. 10, according to the semiconductor device 105, an outer frame 2 is provided as a second frame that surrounds not only its portion on the lateral side but also its portion on the front side. On the back side of the semiconductor device 105, a base plate 6 is provided, and a metal plate 22 is bonded onto the base plate 6 by using a solder 23. Furthermore, an insulating layer 21 is joined onto the metal plate 22, to thereby constitute an insulating board 24. Another metal plate 22 is joined onto the insulating board 24 by using a solder 23, and semiconductor chips 11 are each stacked on the metal plate 22. The semiconductor chips 11 are connected to a terminal 27 and the metal plate 22, by means of bonding wires 25. One end of the terminal 27 is located externally from an outer frame 2 formed of an exterior wall 3 and a reinforcing member 4 and thus, the terminal 27 is configured to allow wiring for the semiconductor device from its outside.

Furthermore, a lateral peripheral region around the semiconductor chips 11 is surrounded by a casing 20 as a first frame formed of a thermosetting resin, such as an epoxy resin, a polyimide resin or the like, or a thermoplastic resin, such as PPS, PET, PBT or the like, and the outer circumference of the casing 20 is surrounded by the outer frame 2 configured with the exterior wall 3 and the reinforcing member 4. Further, on the upper side of the semiconductor chips 11, a cover 19 also as the first frame is disposed, and the cover 19 is surrounded by the outer frame 2 configured with the exterior wall 3 and the reinforcing member 4.

In order to improve the insulating property, a sealant 16 is sealed in the casing 20 or the sealant 16 is filled therein, and here, the material and the filling degree of the sealant 16 may be determined arbitrarily. Note that, the solder 23 as an adhesive may be replaced with sintered silver or a material for liquid-phase diffusion whose melting temperature is higher than the solder, in order to make the semiconductor device 105 capable of high-temperature operation.

As just described, according to this application, not only in the case of a pressure-contact type semiconductor device according to Embodiment 1 but also in the case of a semiconductor device in which electrical connections are established using bonding wires or the like, it is possible to prevent the breakage of the internal component caused by melting of the semiconductor chip 11 from impacting the outside of the semiconductor device, because the outer frame 2 configured with the exterior wall 3 and the reinforcing member 4 is provided. Accordingly, whether or not to employ the outer frame 2 should not be determined depending on the shape of the semiconductor device, so that the semiconductor device may be of any shape.

As described above, in accordance with the semiconductor device 105 according to Embodiment 5, even if the semiconductor device is not of a pressure-contact type but is a semiconductor device in which electrical connections are established using bonding wires or the like, because the outer frame 2 configured with the exterior wall 3 and the reinforcing member 4 is provided, it is possible to prevent the broken pieces of a component that constitutes the semiconductor device from being scattered outside the semiconductor device. Thus, it is possible not only to achieve improvement in the reliability of the entire system, but also to achieve downsizing of the semiconductor device.

It is noted that, in the foregoing Embodiments, the description has been made on cases where the frames are employed as a shock resistant structure for the case where the component bursts due to elevation of the pressure inside the semiconductor device caused by melting of the semiconductor chip 11; however, even in the case where the component does not burst, the frames may, of course, be employed as a structure that can withstand the elevation of the pressure inside the semiconductor device.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS

2: outer frame (second frame), 3: exterior wall, 4: reinforcing member, 7: inner frame (first frame), 11: semiconductor chip, 101, 102, 103, 104, 105: semiconductor device.

The invention claimed is:

1. A semiconductor device, comprising:
a first frame that surrounds an outer circumference of a semiconductor chip; and a second frame that surrounds an outer circumference of the first frame;

wherein the second frame is composed of an exterior wall that surrounds the outer circumference of the first frame, and a fibrous reinforcing member for constraining deformation of the exterior wall, that is wound on an outer circumference of the exterior wall.

2. The semiconductor device according to claim 1, wherein the semiconductor chip is pressed by and between a cover plate and a base plate, to make contact and electrical connection with a front side electrode and a back side electrode for the semiconductor chip.

3. The semiconductor device according to claim 1, wherein the exterior wall is made of a material having a shock resistance and a shock absorptivity that are higher than those of the first frame.

4. The semiconductor device according to claim 2, wherein the exterior wall is made of a material having a shock resistance and a shock absorptivity that are higher than those of the first frame.

5. The semiconductor device according to claim 1, wherein the reinforcing member is made of a material having a rupture strength higher than that of the exterior wall.

6. The semiconductor device according to claim 2, wherein the reinforcing member is made of a material having a rupture strength higher than that of the exterior wall.

7. The semiconductor device according to claim 3, wherein the reinforcing member is made of a material having a rupture strength higher than that of the exterior wall.

8. The semiconductor device according to claim 4, wherein the reinforcing member is made of a material having a rupture strength higher than that of the exterior wall.

9. The semiconductor device according to claim 1, wherein the exterior wall and the reinforcing member are made of polymeric materials.

10. The semiconductor device according to claim 2, wherein the exterior wall and the reinforcing member are made of polymeric materials.

11. The semiconductor device according to claim 3, wherein the exterior wall and the reinforcing member are made of polymeric materials.

12. The semiconductor device according to claim 9, wherein the exterior wall is made of an ultra-high-molecular-weight polyethylene resin.

13. The semiconductor device according to claim 10, wherein the exterior wall is made of an ultra-high-molecular-weight polyethylene resin.

14. The semiconductor device according to claim 11, wherein the exterior wall is made of an ultra-high-molecular-weight polyethylene resin.

15. The semiconductor device according to claim 9, wherein the reinforcing member is made of an ultra-high-molecular-weight polyethylene fiber.

16. The semiconductor device according to claim 10, wherein the reinforcing member is made of an ultra-high-molecular-weight polyethylene fiber.

17. The semiconductor device according to claim 11, wherein the reinforcing member is made of an ultra-high-molecular-weight polyethylene fiber.

18. The semiconductor device according to claim 1, wherein grooves along which the reinforcing member is wound in a fitting manner into the grooves, are provided in the exterior wall.

19. The semiconductor device according to claim 1, wherein the second frame is provided in a cylindrical shape.

20. The semiconductor device according to claim 1, wherein the exterior wall is provided to have a polygonal shape as an outer shape thereof, and a circular shape as an inner shape thereof.

* * * * *